(12) United States Patent
Yoshino

(10) Patent No.: US 7,786,556 B2
(45) Date of Patent: Aug. 31, 2010

(54) SEMICONDUCTOR DEVICE AND LEAD FRAME USED TO MANUFACTURE SEMICONDUCTOR DEVICE

(75) Inventor: Tomoyuki Yoshino, Chiba (JP)

(73) Assignee: Seiko Instruments Inc. (JP)

(*) Notice: Subject to any disclaimer, the term of this patent is extended or adjusted under 35 U.S.C. 154(b) by 0 days.

(21) Appl. No.: 12/215,168

(22) Filed: Jun. 25, 2008

(65) Prior Publication Data
US 2009/0008759 A1    Jan. 8, 2009

(30) Foreign Application Priority Data
Jun. 27, 2007    (JP) ............................. 2007-168472

(51) Int. Cl.
*H01L 21/00* (2006.01)
(52) U.S. Cl. ................ 257/676; 257/666; 257/E21.001
(58) Field of Classification Search ................ 257/666, 257/676, E23.031, E21.001; 438/123
See application file for complete search history.

(56) References Cited

U.S. PATENT DOCUMENTS 5,329,158 A * 7/1994 Lin ............................. 257/666
6,664,136 B2 * 12/2003 Motonami et al. ............ 438/123
2003/0042594 A1   3/2003 Hosaka ........................ 257/690

OTHER PUBLICATIONS

Patent Abstracts of Japan, publication No. 10-223822, publication date Aug. 21, 1998.
Patent Abstracts of Japan, publication No. 2005-050948, publication date Feb. 24, 2005.
Patent Abstracts of Japan, publication No. 2007-274000, publication date Oct. 18, 2007.

* cited by examiner

*Primary Examiner*—Roy K Potter
(74) *Attorney, Agent, or Firm*—Adams & Wilks

(57) ABSTRACT

A semiconductor device has an element encapsulated in a resin mold. Metal leads protruding from the resin mold are solder plated except at the lead-tip end surfaces, and the exposed lead-tip end surfaces have an area less than half the cross-sectional area of the protruding metal leads. The semiconductor device is manufactured using a lead frame in which the metal leads are connected to a frame by plating bars having a thickness smaller than half the thickness of the metal leads. In another embodiment, the metal leads are connected to the frame by plating bars that extend sideways from the metal leads, and the end tips of the metal leads are entirely covered with plating to improve soldering wettability.

4 Claims, 4 Drawing Sheets

SEMICONDUCTOR DEVICE AND LEAD FRAME USED TO MANUFACTURE SEMICONDUCTOR DEVICE

BACKGROUND OF THE INVENTION

1. Field of the Invention

The present invention relates to a semiconductor device manufactured by molding an element such as a semiconductor integrated circuit mounted on a lead frame with resin, and to a manufacturing method for the lead frame.

2. Description of the Related Art

A semiconductor device in which an element such as a semiconductor integrated circuit mounted on a lead frame is molded with resin is generally mounted onto a circuit board for use. In order to ensure sufficient mounting strength between the semiconductor device and the circuit board, leads of the semiconductor device are elongated to enlarge soldering area. Though solder wettability in a cut surface of leads of the semiconductor device, conventionally, has not been kept in good condition, large soldering area and Z-shaped forming of the leads make the solder wettability not only in both ends of the lead but also in heel portions of the leads good, permitting the solder to go up along the leads. Accordingly, a sufficient mounting strength can be ensured.

Large soldering area ensures mounting strength. However, along with the miniaturization of a semiconductor device, the mounting strength against a circuit board tends to be lower. Because increase in mounting density requires reduction both in lead area with which the semiconductor device is bonded to the circuit board, and in electrode area locating on a circuit board side. Solder is mainly used to mount a semiconductor device to a circuit board, and the mounting strength changes widely depending on whether or not the lead of the semiconductor device becomes wet easily with the solder. When the temperature of the solder reaches the melting point by reflow or the like, the solder melts together with plating covering the lead of the semiconductor device. At this time, formation of the plating on the entire lead surface of the semiconductor device is desirable, because a portion where plating is absent does not become wet by the solder and will have low strength. The smaller the semiconductor device is, the less the strength between the lead of the semiconductor device and the electrode of the circuit board becomes when bonded only with the solder. It is, thus, necessary to ensure an area which becomes wet with the solder as much as possible. In particular, the solder wettability is important in a lead-tip portion of the semiconductor device. This is because the lead-tip portion is apt to be affected by influence such as warpage of the circuit board when the semiconductor device is mounted onto the circuit board.

FIG. 6 is a schematic cross-sectional view showing a structure of a conventional semiconductor device. As shown in FIG. 6, in the conventional semiconductor device, a formed lead 2 protrudes from a resin 21. The lead 2 is covered by a plating layer 3 except a lead-tip end surface 12 in a lead-tip cut portion 10 made by cutting the lead 2. The presence of the lead-tip end surface 12 deteriorates the wettability to a soldering material, which serves as a bonding agent at the time of mounting onto a circuit board or the like.

FIG. 7 is a simplified side view showing a structure of a conventional semiconductor device in a manufacturing process step. As shown in FIG. 7, a lead 2, which is also a portion of a lead frame connecting two resins 21 and 31, has a uniform cross-section. When the lead frame having such a structure is cut and the semiconductor devices are separated from one another, the lead-tip end surface 12 as shown in FIG. 6 is formed.

SUMMARY OF THE INVENTION

In order to firmly bond a lead of a semiconductor device with an electrode of a circuit board, there is provided a semiconductor device having a lead in which plating covers entirely a lead-tip portion of the semiconductor device as means for improving solder wettability in the lead of the semiconductor device. Further, as another means, there is provided a semiconductor device having a lead in which an area of a lead-tip cut portion on which plating is not formed is less than half of a cross-sectional area of the lead of the semiconductor device.

According to the present invention, a molten soldering material melted by heat generated in reflow goes up the lead to the upper surface thereof, whereby mounting strength to a circuit board can be improved without enlarging the lead area of the semiconductor device. Further, it is possible to improve strength with respect to warpage or the like of the circuit board on which the semiconductor device is mounted.

DETAILED DESCRIPTION OF THE PREFERRED EMBODIMENTS

Hereinafter, embodiments of a semiconductor device according to the present invention will be described with reference to the drawings.

Figure 1:
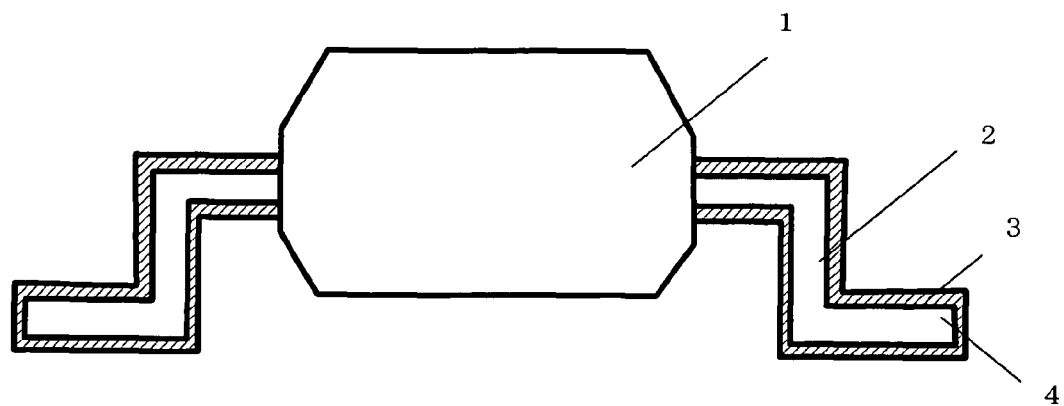
FIG. 1 is a schematic cross-sectional view showing a first embodiment of a semiconductor device according to the present invention.

FIG. 1 is a schematic cross-sectional view showing a structure of a semiconductor device of a first embodiment of the present invention. The semiconductor device includes a resin 1, a lead 2, and a metal plating layer 3 covering the surface of the lead 2. Since elements including a semiconductor integrated circuit (IC chip) are covered by the resin 1, the elements can not be seen from outside thereof generally. One end of the lead 2 is electrically connected to the semiconductor integrated circuit inside the resin 1, and another end thereof protrudes from the resin 1. The protruding portion of the lead 2 is formed into a shape suitable for mounting onto a substrate by the use of a die or the like. The plating layer 3 is formed on the entire surface of a portion of the lead 2 which is exposed to the outside of the resin 1. In the embodiment shown in FIG. 1, the plating layer 3 covers a lead-tip portion 4 of the lead 2 at an end portion thereof so that no surface of the lead is exposed to the outside.

Figure 2:
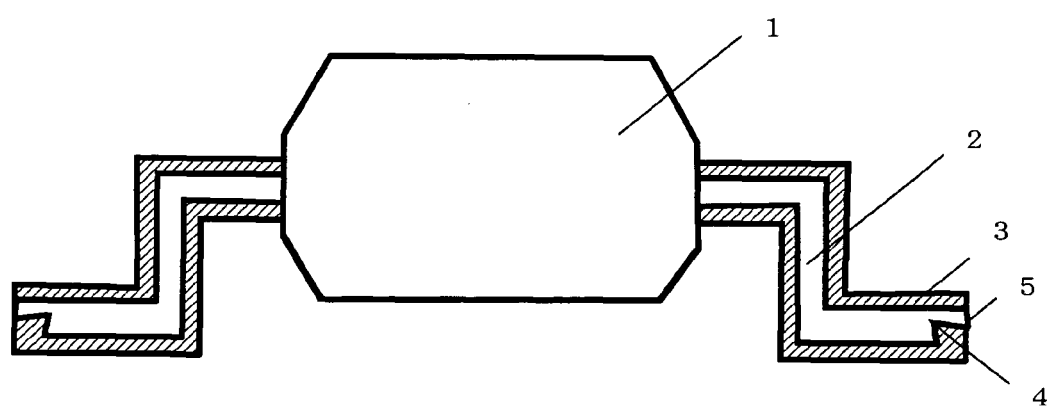
FIG. 2 is a schematic cross-sectional view showing a second embodiment of the semiconductor device according to the present invention.

FIG. 2 is a schematic cross-sectional view showing a structure of a semiconductor device of a second embodiment of the present invention. In the embodiment shown in FIG. 2, the lead-tip portion of the lead 2 has a portion covered by the plating layer 3, and a lead-tip end surface 5 not covered by the plating layer 3. A cross-sectional area of the lead-tip end surface 5 is made smaller than a half of the cross-sectional area of the lead 2. Consequently, at the time of mounting the semiconductor device onto a circuit board or the like, it is easy for a soldering material to wet the plating layer, permitting the solder to go up the lead-tip portion to form a rigid mounting state.

Figure 3:
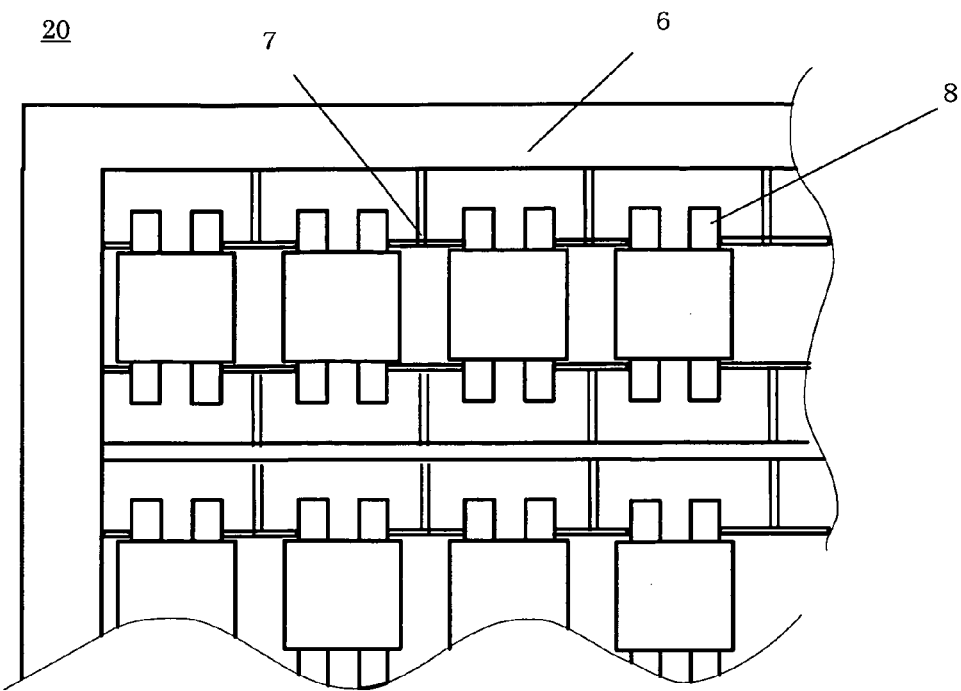
FIG. 3 is a schematic plan view showing the first embodiment of a lead frame according to the present invention.

FIG. 3 shows a first embodiment of a lead frame according to the present invention, that is, shows an aggregate in which a plurality of semiconductor devices are arranged on a single lead frame 20. A lead 8 of each of the semiconductor devices is connected to another lead 8 by a plating bar 7, and the plating bar 7 is joined to a side surface of the lead 8 and to a frame 6. The plating bar 7 is a path for electric current at a time of performing electrolytic plating on a lead frame 20. With the structure in which the plating bar 7 is joined to the side surface of the lead 8, the semiconductor device whose lead-tip portion 4 is entirely covered by the plating layer 3 can be manufactured as shown in FIG. 1.

Figure 4:
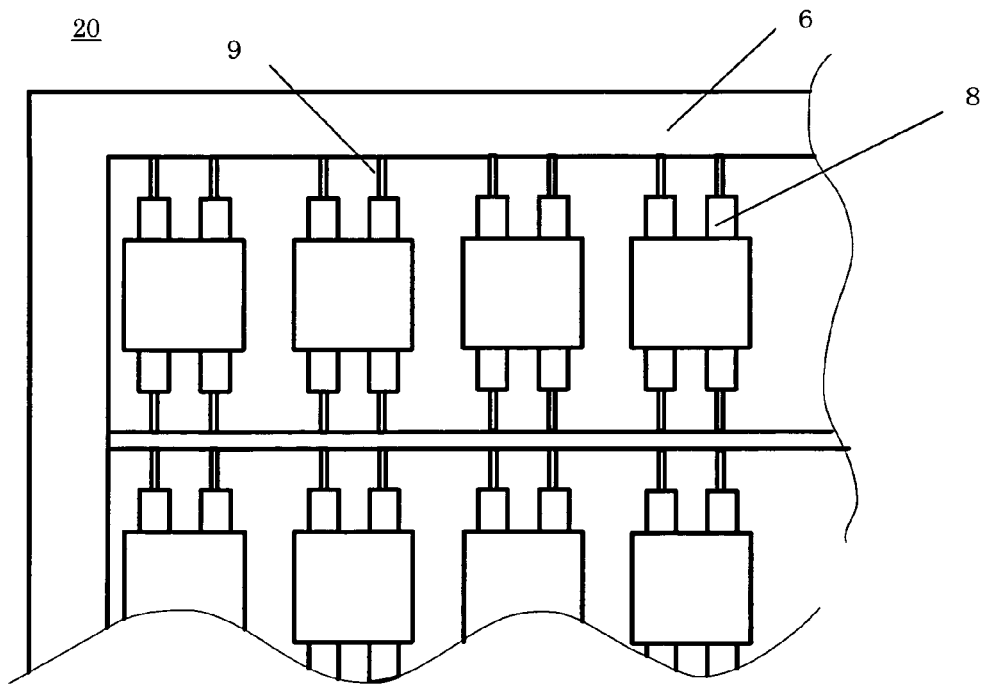
FIG. 4 is a schematic plan view showing the second embodiment of the lead frame according to the present invention.

FIG. 4 shows a second embodiment of the lead frame according to the present invention, that is, shows an aggregate in which a plurality of semiconductor devices are arranged on a single lead frame 20. In this embodiment, a lead 8 of each of the semiconductor devices is extended to form a plating bar 9 and joined to a frame 6. The plating bar 9 is a path for electrical current at a time of performing electrolytic plating on the lead frame 6. A portion where the plating bar 9 is joined to the lead 8 becomes a cut surface after cutting the lead 8 later, and plating is not applied to the portion. Accordingly, it is desirable that the cross-sectional area of the plating bar 9 is smaller than a half of the cross-sectional area of lead 8, and is even finer and thinner as much as possible.

Figure 5:
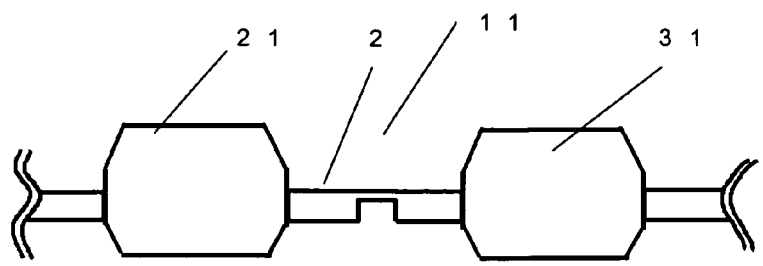
FIG. 5 is a schematic side view partially showing the lead frame according to the present invention.
Figure 6:
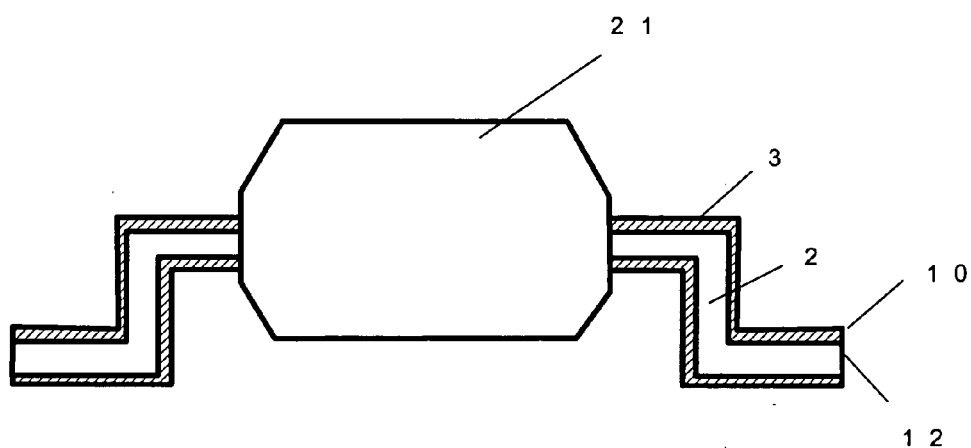
FIG. 6 is a schematic cross-sectional view showing a structure of a conventional semiconductor device.
Figure 7:
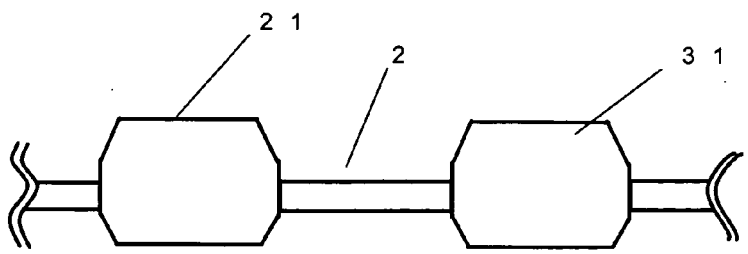
FIG. 7 is a schematic side view partially showing a conventional lead frame.

FIG. 5 is a side view of a semiconductor device according to the second embodiment of the present invention and shows an intermediate state of a manufacturing process step in which two adjacent semiconductor devices 21 and 31 are connected to each other by a lead frame. As shown in FIG. 5, in this embodiment, a lead frame thin portion 11 is formed in a lead frame 2. Cutting the lead frame thin portion 11 between the semiconductor devices to separate from one another, the semiconductor device having the structure of the embodiment shown in FIG. 2 can be obtained.

Figure 8:
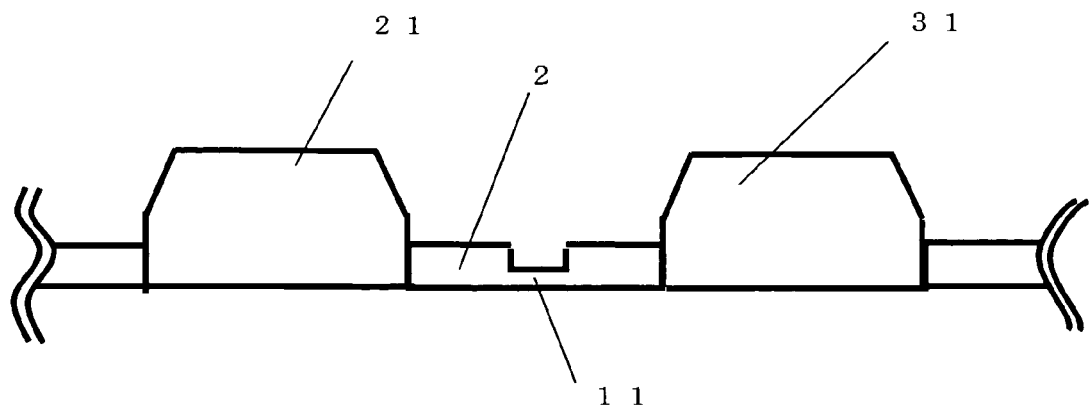
FIG. 8 is a schematic side view showing a third embodiment of the semiconductor device according to the present invention.
Figure 9:
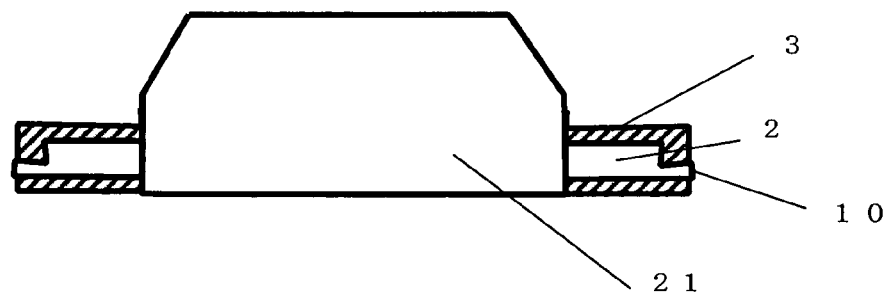
FIG. 9 is a schematic cross-sectional view showing the third embodiment of the semiconductor device according to the present invention.

FIG. 8 is a side view of the semiconductor device according to a third embodiment of the present invention and shows an intermediate state of a manufacturing process step in which two adjacent semiconductor devices are connected to each other by a lead frame. As shown in FIG. 8, in this embodiment, a lead frame thin portion 11 is formed in a lead frame 2. The lead frame thin portion 11 locates on a lower surface side where the semiconductor device is mounted onto a circuit board. Cutting the lead frame thin portion 11 between the semiconductor devices to separate from one another, a semiconductor device having the structure of the third embodiment shown in FIG. 9 can be obtained. With this structure, the upper surface of the lead is easy to become wet with the solder printed on the circuit board.

In a forming method of the lead frame thin portion 11, at first a lead frame is cut into a desired shape by using a press die and then partial processing continues. As the partial processing, there are a method of forming a thin portion through etching by using chemicals, a method of performing a local crushing processing through press working, and other methods.

Finally, manufacturing process steps are schematically described. A semiconductor integrated circuit (IC chip) is bonded to a lead frame to make connection between the semiconductor integrated circuit and each lead by a wire. Next, the semiconductor integrated circuit is covered by a resin. Up to this process step, embodiments shown in FIGS. 3 and 4 are obtained. Then, plating is performed and a portion other than the resin is covered by film of plating. Further, the lead frame is cut by using a die or the like to separate the semiconductor devices from each other.

The semiconductor device according to the present invention can be widely used for products that are required to be small and light, such as mobile phones, laptop personal computers, and mobile electronic equipment.

What is claimed is:

1. A semiconductor device, comprising:
   an element covered with a resin mold; and
   a metal lead having a protruding portion protruding from the resin mold and a lead-tip portion with a lead-tip end surface at a tip of the protruding portion,
   wherein the protruding portion and the lead-tip portion except the lead-tip end surface are covered by a solder plating, and
   wherein the lead-tip end surface has an area less than half of a cross-sectional area of the protruding portion of the metal lead.

2. A lead frame used in manufacture of a semiconductor device that has an element covered with a resin mold and a lead protruding from the resin mold, the lead frame, comprising:
   a frame;
   a lead; and
   a plating bar,
   wherein the lead is connected to the frame by the plating bar arranged on a side surface of the lead protruding from the resin mold, and the plating bar constitutes a path for electric current when performing electrolytic plating on the frame.

3. A lead frame used in manufacture of a semiconductor device that has an element covered with a resin mold and a lead protruding from the resin mold, the lead frame, comprising:
   a frame;
   a lead; and
   a plating bar,
   wherein the lead has a lead-tip end surface at an end of the lead protruding from the resin mold, the lead-tip end surface being connected to the frame by the plating bar having a cross-sectional area smaller than a half of a cross-sectional area of the lead.

4. A lead frame used in manufacture of a semiconductor device that has an element covered with a resin mold and a lead protruding from the resin mold, the lead frame, comprising:
   a frame;
   a lead; and
   a plating bar,
   wherein the lead has a lead-tip end surface at an end of the lead protruding from the resin mold, the lead-tip end surface being connected to the frame by the plating bar having a thickness smaller than a half of a thickness of the lead measured from a bottom surface side on which the semiconductor device is mounted onto a circuit board.

* * * * *